United States Patent
Mase et al.

(10) Patent No.: US 11,389,929 B2
(45) Date of Patent: Jul. 19, 2022

(54) METHOD FOR SURFACE TREATMENT OF WORKPIECE MADE FROM HARD-BRITTLE MATERIAL

(71) Applicant: FUJI MANUFACTURING CO., LTD., Tokyo (JP)

(72) Inventors: Keiji Mase, Tokyo (JP); Shozo Ishibashi, Tokyo (JP); Mizuki Sekizawa, Tokyo (JP)

(73) Assignee: FUJI MANUFACTURING CO., LTD., Tokyo (JP)

( * ) Notice: Subject to any disclaimer, the term of this patent is extended or adjusted under 35 U.S.C. 154(b) by 782 days.

(21) Appl. No.: 16/253,557

(22) Filed: Jan. 22, 2019

(65) Prior Publication Data

US 2019/0283212 A1   Sep. 19, 2019

(30) Foreign Application Priority Data

Mar. 19, 2018   (JP) .............................. JP2018-050629

(51) Int. Cl.
*B24B 1/00*  (2006.01)
*B24C 1/08*  (2006.01)
(Continued)

(52) U.S. Cl.
CPC ................ *B24C 1/08* (2013.01); *B24C 11/00* (2013.01); *H01L 21/3046* (2013.01);
(Continued)

(58) Field of Classification Search
CPC ....... B24C 1/08; B24C 11/08; H01L 21/3046; H01L 21/6831; H01L 21/68757
(Continued)

(56) References Cited

U.S. PATENT DOCUMENTS

| 10,068,790 B2* | 9/2018 | Kouno | ................ H01L 21/6831 |
| 2014/0329441 A1* | 11/2014 | Mase | ................... C09K 3/1409 |
| | | | 451/39 |
| 2017/0066108 A1* | 3/2017 | Matsuyuki | ........... H04B 1/3888 |

FOREIGN PATENT DOCUMENTS

| CN | 1334346 A | 2/2002 |
| CN | 101379212 A | 3/2009 |

(Continued)

OTHER PUBLICATIONS

Corresponding Chinese Appl. No. 201910159501.7, Chinese Office Action dated Sep. 14, 2020.
(Continued)

*Primary Examiner* — Joseph J Hail
*Assistant Examiner* — Shantese L McDonald
(74) *Attorney, Agent, or Firm* — Ronald M. Kachmarik; Cooper Legal Group LLC

(57) ABSTRACT

A method for surface treatment of a workpiece made from a hard-brittle material comprises first blasting employing abrasive grains of higher hardness than a hardness of a base material of the workpiece for forming a three dimensional recess-protrusion profile having protrusions and recesses formed between the protrusions on a surface of the workpiece; and second blasting employing an elastic abrasive having a structure in which abrasive grains carried in and/or on an elastic body made from material with low rebound elasticity for polishing the surface of the workpiece formed with the recess-protrusion profile so as to achieve an arithmetic average roughness Ra of not greater than 1.6 μm on the surface of the protrusions and the recesses on the workpiece while maintaining the recess-protrusion profile formed by the first blasting.

14 Claims, 7 Drawing Sheets

(51) Int. Cl.
  *H01L 21/304* (2006.01)
  *B24C 11/00* (2006.01)
  *H01L 21/687* (2006.01)
  *H01L 21/683* (2006.01)
  *B24C 3/32* (2006.01)

(52) U.S. Cl.
  CPC .... *H01L 21/6875* (2013.01); *H01L 21/68757* (2013.01); *B24C 3/322* (2013.01); *H01L 21/6831* (2013.01)

(58) Field of Classification Search
  USPC .......................................... 451/38, 39, 102
  See application file for complete search history.

(56) References Cited

FOREIGN PATENT DOCUMENTS

| | | | |
|---|---|---|---|
| CN | 105458940 A | 4/2016 | |
| CN | 106926144 A | 7/2017 | |
| CN | 107745334 A | 3/2018 | |
| JP | 2002-334920 | 11/2002 | |
| JP | 2006-192546 | 7/2006 | |
| JP | 2008-112751 | 5/2008 | |
| JP | 2012-040744 | 3/2012 | |
| JP | 2012040744 A | 3/2012 | |
| JP | 2013-022684 | 2/2013 | |
| JP | 2013052469 A | 3/2013 | |
| JP | 2014-018893 | 2/2014 | |
| JP | 2014027207 * | 2/2014 | ........... H01L 21/683 |
| JP | 2014027207 A | 2/2014 | |
| JP | 2016068188 A | 5/2016 | |

OTHER PUBLICATIONS

Corresponding Japanese Appl. No. 2018-050629, Japanese Office Action dated May 30, 2019.

* cited by examiner

After first blasting

Laser microscope image
(at 1000-fold magnification)    Profile measurement data

After second blasting
Laser microscope image
(at 1000-fold magnification)    Profile measurement data After first blasting
Laser microscope image
(at 1000-fold magnification)

Profile measurement data

Measured cross-section profile

Roughness profile

Ra : 0.445 μm    Rz : 2.737 μm

After second blasting
Laser microscope image
(at 1000-fold magnification)

Profile measurement data

Measured cross-section profile

Roughness profile

Ra : 0.175 μm    Rz : 1.036 μm

After first blasting
Laser microscope image
(at 1000-fold magnification)

Pin edge R: 4.150 μm

Profile measurement data

Measured cross-section profile

Roughness profile

Side surface of the protrusion  Ra: 1.856 μm

Measured cross-section profile

Roughness profile

Upper surface of the protrusion  Ra: 0.681 μm

After second blasting
Laser microscope image
(at 1000-fold magnification)

Pin edge R: 52.884 μm

Profile measurement data
Measured cross-section profile

Roughness profile

Side surface of the protrusion  Ra: 0.973 μm

Measured cross-section profile

Roughness profile

Upper surface of the protrusion  Ra: 0.106 μm

METHOD FOR SURFACE TREATMENT OF WORKPIECE MADE FROM HARD-BRITTLE MATERIAL

BACKGROUND OF THE INVENTION

1. Field of the Invention

The present invention relates to a method for surface treatment of a workpiece made from a hard-brittle material. For example, the present invention relates to a method for surface treatment to form a multitude of minute projections on a substrate suction surface of a ceramic dielectric layer provided on an electrostatic chuck device, and then polish the substrate suction surface after the minute projections have been formed thereon. In this method, the surface of a workpiece made from a material that is both hard and brittle such as ceramics is processed into a three dimensional recess-protrusion profile which is configured from fine protrusions and recesses having a width approximately from several tens of μm to a few mm. The surface of the workpiece processed into the three dimensional profile is then polished thereon while maintaining the three dimensional profile.

2. Description of the Related Art

An example will now be given of a dielectric layer configuring a suction surface of an electrostatic chuck device used in processes for fabricating semiconductors, as an example of an article made from a hard-brittle material.

In fabrication or manufacture of semiconductor, a substrate such as a semiconductor wafer, glass, or the like is placed on a holding body called a susceptor, and various processes such as film forming, light exposing and etching are performed while the substrate is being held in a fixed state inside processing equipment. A fixing device such as an electrostatic chuck is provided on the substrate suction surface of such a susceptor in order to attract the substrate onto the susceptor to fix the substrate thereon.

Such an electrostatic chuck 10 is configured for example as illustrated in FIG. 6. The electrostatic chuck 10 includes a metal electrode layer 12 serving as an electrode and provided on a ceramic plate 11, and a dielectric layer 13 made from ceramics and forming a suction surface to attach a substrate 15 onto. A voltage is, for example, applied across the metal electrode layer 12 and the substrate 15, so as to enable the substrate 15 to be attracted by suction toward the surface of the dielectric layer 13 and be fixed thereon by Coulomb force generated between the metal electrode layer 12 and the substrate 15.

The substrate suction surface of such a dielectric layer 13 is formed with a flat profile. However, in order to reduce the contact surface area with the substrate to reduce leakage current (see Paragraph [0004] of Patent Document 1), or in order to introduce gas serving as a heating medium between the dielectric layer and the substrate to improve the uniformity of heating of the substrate (see Paragraph [0067] of Patent Document 2), the substrate suction surface of the ceramic dielectric layer is formed into a three dimensional recess-protrusion surface formed with a multitude of minute projections and grooves (see Patent Documents 1 and 2).

There is a demand in fabrication of semiconductor to avoid the generation of minute contaminants such as particles (foreign matter particles) that have a detrimental effect on yield and reliability of semiconductor products. This means that the suction surface of the dielectric layer of such an electrostatic chuck is preferably treated so as to achieve a state in which particles are not liable to be generated.

As illustrated in the enlarged illustration in FIG. 7, when the surface roughness of the substrate suction surface of the dielectric layer 13 is rough and a multitude of sharp peaks are revealed microscopically in the roughness profile, such peak portions t on the roughness profile may break off to form particles.

In the recesses and protrusions on the surface of the dielectric layer 13, when there are sharp edges e formed at end portions on upper surfaces 22 of protrusions 21, such sharp edges e might readily break off and particles be generated thereby.

Thus, to suppress the generation of such particles, the substrate suction surface of the dielectric layer 13 is preferably smoothed by polishing, and the edges e are preferably rounded by polishing.

Patent Document 2 discloses methods for polishing such a dielectric layer 13, including polishing using a grindstone and a lapping process employing an abrasive (lapping agent) in which abrasive particles are suspended (Paragraph [0068] of Patent Document 2).

Although not related to a method for polishing the dielectric layer 13 of the electrostatic chuck 10, there is a proposal for a polishing method for a substrate made from a hard-brittle material such as glass, a silicon wafer, or a ceramic substrate. In this method, polishing is performed by introducing a free-abrasive-grain slurry between a surface to be treated of a workpiece and a fixed-abrasive-grain polishing tool to which abrasive grains made from a porous body having pores are fixed (see Patent Document 3).

As illustrated in FIG. 8, there is also a proposal of a method for polishing glass, ceramics, and metals in which, polishing is performed using a polishing pad 30 having column-shaped or frustum-shaped tip portions 33 provided on pedestals 32 formed to one side surface of a base layer 31 (see Patent Document 4).

Furthermore, although not related to polishing of a dielectric layer of an electrostatic chuck, the applicant of the present application has filed an application which relates to a method for polishing side portions of a substrate made from a hard-brittle material. In the method, an elastic abrasive having abrasive grains for polishing dispersed in an elastic base material, or having abrasive grains for polishing adhered to the surface of an elastic base material is ejected together with compressed gas from an ejection nozzle toward side portions of a workpiece configured by the substrate made from a hard-brittle material, thereby the elastic abrasive is caused to impact the side portions so as to polish the side portions of the workpiece. The above application has already been granted as patent (Patent Document 5).

There is also a proposal for a method for surface treatment of a mold that uses an elastic abrasive. In this method, first blasting is performed to the surface of a manufactured mold to remove a hardened layer generated on the surface and/or to adjust the surface roughness. Second blasting is then performed to form minute recesses and protrusions on the surface, followed by a further flattening process in which third blasting is performed to remove peak portions of the recesses and protrusions formed on the surface. In the third blasting, an elastic abrasive having abrasive grains kneaded into an elastic body and/or having abrasive grains carried in and/or on the surface of the elastic body, is ejected with an ejection angle inclined to the surface of the mold thereby cause the ejected abrasive to slide over the surface of the mold (see claims 1 and 2 of Patent Document 6).

RELATED ARTS

Patent Documents

Patent Document 1: Japanese Patent Laid-Open No. 2002-334920
Patent Document 2: Japanese Patent Laid-Open No. 2008-112751
Patent Document 3: Japanese Patent Laid-Open No. 2006-192546
Patent Document 4: Japanese Patent Laid-Open No. 2014-018893
Patent Document 5: Japanese Patent No. 5793014
Patent Document 6: Japanese Patent No. 5606824

The polishing using a grindstone and lapping processes described in Patent Document 2, and the polishing method described in Patent Document 3 are each polishing methods for flat surfaces, and are appropriately applied to polishing a dielectric layer of an electrostatic chuck having a flat surface.

However, when the surface of a dielectric layer 13 is formed with a three dimensional recess-protrusion profile on which a multitude of minute projections formed thereon as described above etc., as illustrated in FIG. 7, although the upper surfaces 22 of the protrusions 21 in the recesses and protrusions can be polished in the polishing using a grindstone or the lapping process, side surfaces 23 of the protrusions 21 as well as bottom surfaces 25 of recesses 24 are unable to be polished thereby. As a result, the surface roughness of such portions remains in the original rough state, thus the particles might be generated from such portions as described above.

In the polishing employing the polishing pad 30 described in Patent Document 4 (see FIG. 8), even if the surface of the polishing surface is curved into a curved surface or the like or has an undulating shape, a state in which the tip portions 33 of the polishing pad 30 contact the polishing surface can be maintained during polishing by deforming the base layer 31 of the polishing pad 30 so as to follow changes in the shape of the polishing surface.

However, when the polishing surface has a three dimensional form due to minute recesses and protrusions being formed thereon as described above, the tip portions 33 of the polishing pad 30 are unable to enter into the recesses 24, and so the side surfaces 23 of the protrusions 21 and the bottom surfaces 25 of the recesses 24 are unable to be polished by this method.

Moreover, due to polishing being concentrated on the upper surfaces 22 of the protrusions 21 in each of the polishing methods described above, the above polishing methods are unable to polish while maintaining the initial recess-protrusion profile, because the recess-protrusion profile formed on the surface of a workpiece prior to polishing is changed by the polishing.

Moreover, in each of the above polishing methods for forming the recesses and protrusions on the dielectric layer 13, completely different methods, devices, and equipment are employed compared to subsequent polishing thereof. This complicates the processing process, and results in a high initial investment requirement to provide the processing equipment etc. needed for each processing.

Patent Document 5 discloses polishing of the end portions (side surfaces) of a substrate made from glass, which is a hard-brittle material, to a mirror finished surface by blasting the glass with an elastic abrasive.

However, the end portions (side surfaces) of the glass substrate subjected to polishing in Patent Document 5 are flattened planar surfaces or curved surfaces having no projections or the like formed thereon, and are not surfaces to be polished that have a three dimensional profile formed with a multitude of fine recesses and protrusions such as the surface of the dielectric layer 13 of the electrostatic chuck 10.

Moreover, there is a disclosure of a configuration in Patent Document 6 in which blasting (the third blasting) is performed using an elastic abrasive against the surface of a metal mold after fine recesses and protrusions have been formed by the second blasting. However, the third blasting is employed to perform flattening by scraping the peak portions of the recesses and protrusions formed by the second blasting. Accordingly, this is irrelevant to a method to polish the side surfaces of the protrusions and the bottom surfaces of the recesses while maintaining the recess-protrusion profile formed by the second blasting.

Accordingly, a polishing method performed on the surface of a workpiece rendered with an recess-protrusion surface formed with fine projections, and, in particular, on a substrate suction surface of a fixing device employed in a device for fabricating semiconductor such as to a dielectric layer of an electrostatic chuck as described above is demanded so as to be capable of polishing not only the upper surfaces of protrusions, but also the side surfaces of the protrusions and the bottom surfaces of the recesses while maintaining the recess-protrusion profile that has been rendered thereon.

The present invention is configured to address the deficiencies of the related art described above thus directed to provide a method for surface treatment of a workpiece made from a hard-brittle material capable to form a three dimensional recess-protrusion profile having fine projections or the like on a surface of the workpiece as well as to polish the surface of the workpiece that has been formed with the recess-protrusion profile by employing a comparatively simply and similar type of work. This method is also capable of polishing the entire surface of recesses and protrusions including upper surfaces and side surfaces of the protrusions and the bottom surfaces of the recesses etc., while maintaining the recess-protrusion profile that has been rendered on the surface of the workpiece.

SUMMARY OF THE INVENTION

Means for solving the problems are described below with reference numerals used in the detailed description of the preferred embodiments. These reference numerals are intended to clarify the correspondence between the descriptions in the claims and the descriptions in the detailed description of the preferred embodiments, and it is needless to say that these reference numerals should not be used to restrictively interpret the technical scope of the present invention.

In order to achieve the object described above, a method for surface treatment of a workpiece made from a hard-brittle material such as ceramics, glass or the like according to the present invention comprises:

performing first blasting employing abrasive grains of higher hardness than a hardness of a base material of the workpiece for forming a three dimensional recess-protrusion profile on a surface of the workpiece, the three dimensional recess-protrusion profile obtained by the first blasting having a multitude of protrusions 21, and a multitude of recesses 24 formed between the protrusions 21 with a width w of at least 50 μm at narrowest portions between the protrusions 21; and performing second blasting employing an elastic abrasive having a structure in which abrasive grains with a smaller particle diameter than the width w of the recesses 24 are carried on and/or in an elastic body made from material with low rebound elasticity for polishing the surface of the workpiece formed with the recess-protrusion profile so as to achieve an arithmetic average roughness Ra of not greater than 1.6 μm on the surface of the protrusions 21 and the recesses 24 on the workpiece while maintaining the recess-protrusion profile formed by the first blasting.

Preferably, when the protrusions 21 with flat upper surfaces 22 are formed by the first blasting, edges formed at ends of the upper surfaces 22 of the protrusions 21 are rounded to a radius of not less than 10 μm by the second blasting.

Furthermore, the surface of the workpiece made from a hard-brittle material may be a substrate suction surface of a substrate fixing tool provided in equipment for fabrication of semiconductor such as an electrostatic chuck.

Preferably, the second blasting includes ejection of the elastic abrasives against the surface of the workpiece from at least four directions in plain view.

The elastic abrasive employed in the second blasting may include abrasive grains carried in and/or on an elastic body made from rubber or elastomer having a low rebound elasticity, and the abrasive grains are made of the material selected from the group comprising diamond, boron nitride, carborundum, green carborundum, alumina, white alumina, and boron carbide. An average particle diameter of the abrasive grains is within a range from 0.1 μm to 100 μm and smaller than the width of the recesses 24.

Preferably, upper surfaces of protrusions on the substrate suction surface of the substrate fixing tool provided in the equipment for fabrication of semiconductor are polished by the second blasting to an arithmetic average roughness Ra of not greater than 0.2 μm.

Effect of the Invention

Due to the present invention being configured as described above, the surface treatment method of the present invention as described above is able to obtain the following significant advantageous effects.

By the first blasting, the three dimensional recess-protrusion profile can be formed on the surface of the workpiece with comparative ease, and, by the second blasting employing the elastic abrasive, the entire surface of the three dimensional recess-protrusion profile including not only the protrusions 21 but also the bottom surfaces 25 of the recesses 24 etc., can be comparatively easily rendered to a surface roughness Ra (arithmetic average roughness) of not greater than 1.6 μm while maintaining the recess-protrusion profile formed by the first blasting.

As a result, by applying the method of the present invention to parts employed inside vacuum deposition film forming equipment such as a substrate suction surface on a dielectric layer 13 of an electrostatic chuck 10 for forming a multitude of minute projections, the dielectric layer 13 of the electrostatic chuck 10 treated by the method of the present invention is polished not only on portions thereof that make contact with the substrate (the upper surfaces 22 of the protrusions 21) but also on the side surfaces 23 of the protrusions 21 and the bottom surfaces 25 of the recesses 24. As a result, the dielectric layer 13 of the electrostatic chuck 10 is less prone to become the source of contamination (the source of particle generation) to the substrate 15 such as a silicon wafer.

In the surface treatment method of the present invention, both of the recess and protrusion formation step and the subsequent polishing step can be performed by blasting, thus the treatment in the above both steps can be accomplished by the similar work flow. This enables processing to be simplified, and enables to reduce production costs to be achieved due to common use or the like of the entire blasting apparatus or some elements of the blasting apparatus.

In this manner, when the workpiece is an article made from a transparent material such as glass or the like, the workpiece subjected to the treatment according to the present invention can be rendered transparent after polishing by comparatively simply polishing of the entire recess-protrusion surface thereon, including not only the protrusions 21 but also the bottom surfaces 25 of the recesses 24, while maintaining the initial recess-protrusion profile. Moreover, by making the surface smooth, the treatment is able to attain a surface state in which dirt or the like is not liable to adhere, and even were dirt to adhere, enables the dirt to be easily removed.

When the protrusions 21 formed by the first blasting have a shape including flat upper surfaces 22 and the edges e formed at the ends of the upper surfaces are formed with a sharp profile, such portions might readily break off and becomes a generation source of particles as described above, or might act as the origin for breaks in the workpiece. However, due to adopting the configuration in which the edges e formed at the ends of the upper surfaces 22 on the protrusions 21 are rounded by the second blasting to a radius of not less than 10 μm, the edges e can be appropriately prevented from being the generation source of particles or becoming the origin for breaks such as chipping.

BRIEF DESCRIPTION OF THE DRAWINGS

The objects and advantages of the invention will become apparent from the following detailed description of preferred embodiments thereof provided in connection with the accompanying drawings in which:

FIG. 1 illustrates scanning electron microscope (SEM) images of surfaces of a workpiece in an Example 1.

FIG. 2 illustrates laser microscope images and profile measurement data of protrusions on a surface of a workpiece in Example 1.

FIG. 3 illustrates laser microscope images and profile measurement data of bottom surfaces of recesses on a surface of a workpiece in Example 1.

DETAILED DESCRIPTION OF THE PREFERRED EMBODIMENTS

Figure 1A:
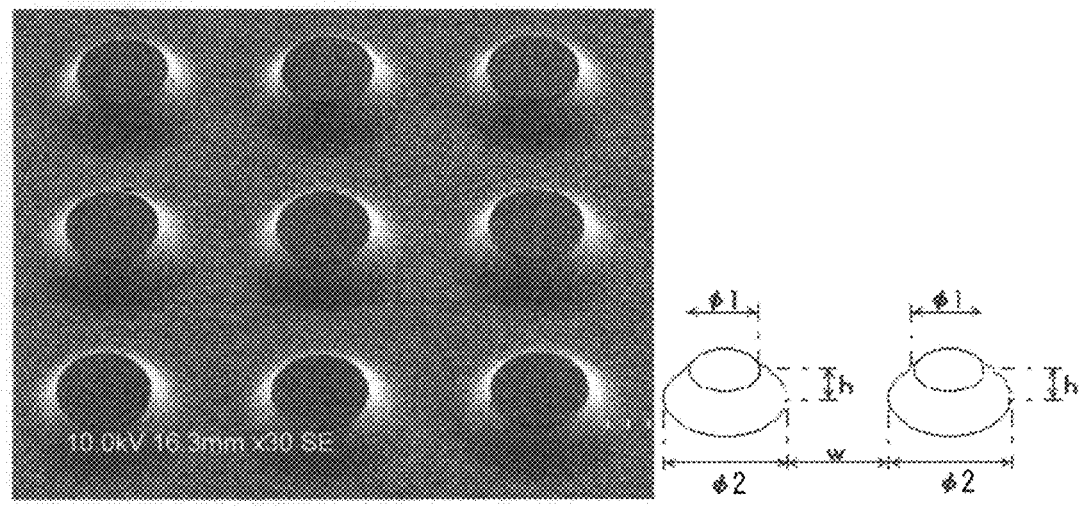
FIG. 1A illustrates a state after first blasting and FIG. 1B illustrates a state after second blasting.

Explanation follows regarding embodiments of the present invention, with reference to the appended drawings.
Workpiece Workpieces to be subjected to the surface treatment method of the present invention include workpieces in general that are made from a material that is both hard and brittle. Examples of such hard-brittle materials include alumina, silicon carbide, silicon nitride, sapphire, zirconia, aluminum nitride, cermet, quartz glass, soda glass, and the like.

A substrate suction surface of a ceramic dielectric layer of an electrostatic chuck will be given as an example of a surface of a workpiece, but not restricted thereto. In the present invention, any article made from a hard-brittle material provided with a surface having an recess-protrusion profile formed with projections, grooves, or the like may generally applicable as the workpieces.
First Blasting In first blasting, abrasive grains of higher hardness than the hardness of the base material of a workpiece made from a hard-brittle material are ejected against the workpiece to form a predetermined three dimensional recess-protrusion profile including plural protrusions 21 formed on the surface of the workpiece as well as plural recesses 24 formed between the protrusions 21.

The recess-protrusion profile may be formed with projections having a columnar shape such as circular columns or angular columns or a frustum shape such as a truncated cone or truncated pyramid, or may be formed with an recess-protrusion profile by forming a multitude of grooves or holes. Such grooves or holes may be bottomed holes or through holes.

When the recess-protrusion profile is formed on the surface of the workpiece by forming projections, these projections are the protrusions 21 referred to above, and the recesses 24 are formed between these protrusions 21.

Moreover, when an recess-protrusion profile is formed on the surface of the workpiece by forming grooves or holes, the portions where the grooves or holes are formed are the recesses 24 referred to above, and the remaining other portions (the portions where the grooves or holes are not formed) are the protrusions 21 referred to above.

In such an recess-protrusion profile, if the width of the recesses 24 is too small, then the elastic abrasive is unable to sufficiently polish the side surfaces 23 of the protrusions 21 and the bottom surfaces 25 of the recesses 24 in second blasting described later. Therefore, the recess-protrusion profile is formed such that a width w at narrowest portions of the recesses 24 is no less than 50 µm.

Prior to performing the first blasting, a blasting-resistant masking member may be adhered to the surface of the article to protect portions as required where cutting is not to be performed.

A predetermined pattern of the projections and grooves or holes etc. may be formed on the surface of the workpiece by adhering the masking member, enabling a predetermined three dimensional recess-protrusion profile to be rendered on the surface of the workpiece.

The abrasive grains employed in the first blasting have higher hardness than the hard-brittle material of the base material of the workpiece. As an Example thereof include abrasive grains of alumina, white alumina, carborundum, green carborundum, boron carbide, diamond and the like, which may be selected according to the hardness of the base material of the workpiece. The shape of the abrasive grain employed may also be polygonal shapes (grit) and/or spherical shapes without corners (shot).

The particle diameter of the abrasive grains employed is selected according to the dimensions of the recesses and protrusions formed, the material employed for the base material of the workpiece subjected to treatment, etc., and an average particle diameter thereof is in a range of from 1 µm to 1000 µm, preferably in a range of from 3 µm to 200 µm, and more preferably in a range of from 10 µm to 60 µm.

The above abrasive grains may be ejected using various known types of blasting apparatus. Examples of a wide range of possible blasting apparatuses that eject abrasive at a predetermined ejection speed and ejection angle against a surface to be treated of a workpiece include blasting apparatuses using dry blasting in which an abrasive is ejected using a compressed fluid such as compressed air or wet blasting, as well as other blasting apparatuses using a centrifugal method (impeller method) to eject abrasive by imparting centrifugal force to the abrasive by rotating an impeller, and a stamping method in which an abrasive is propelled by throwing the abrasive by a stamping rotor. However, a dry blasting apparatus using air is preferably employed due to being comparatively easy to control the ejection pressure, ejection speed, ejection range, etc.

Commercially available examples of such dry air type blasting apparatuses include a suction type blasting apparatus that sucks an abrasive using a negative pressure generated by ejecting compressed gas and ejects the abrasive by merging the abrasive with the compressed gas flow, a gravity type blasting apparatus that causes abrasive falling from an abrasive tank to be carried by compressed gas and ejected, a direct pressure type blasting apparatus in which compressed gas is introduced into a tank filled with abrasive and the abrasive is ejected by merging the abrasive flow from the abrasive tank with a compressed gas flow from a separately provided compressed gas supply source, and a blower type blasting apparatus that carries and ejects the compressed gas flow from such a direct pressure type blasting apparatus with a gas flow generated by a blower unit. Any one of the above may be employed in the first blasting described above.

The speed at which the abrasive grains are propelled and the ejection pressure etc. of an air type blasting apparatus may be set so as to impart a desired speed and energy to the abrasive, and may be selected according to the purpose for treatment, the abrasive being employed, the material of the workpiece, and other conditions. When an air type blasting apparatus is employed as the blasting apparatus then the ejection pressure may, for example, be adjusted so as to lie in a range of from 0.05 MPa to 0.6 MPa.

The ejection angle of the abrasive with respect to the workpiece is adjustable according to the shape and the like of the surface to be treated of the workpiece so as to lie in a range from 10° to 90°. The distance (ejection distance) from the tip of the ejection nozzle to the surface of the workpiece is adjustable according to the purpose for treatment and the shape of the workpiece, the abrasive being employed, the material of the workpiece, and other conditions so as to lie in a range from 0.5 mm to 300 mm
Second Blasting The surface having a three dimensional recess-protrusion profile formed by cutting with the first blasting is a microscopically rough surface due to impact of the abrasive. Accordingly, the particles referred to above are readily generated, and chipping or cracks readily occur. Moreover, the surface becomes non-transparent, in the manner of frosted glass, when the workpiece is configured from a transparent material.

Thus, the second blasting is performed in which an elastic abrasive is ejected against the surface of the workpiece formed with the recess-protrusion profile by the first blasting as described above. By the second blasting, the upper surfaces 22 of the protrusions 21, and also the side surfaces 23 of the protrusions 21 and the bottom surfaces 25 of the recesses 24 are polished to a mirror finished surface, and the edges e formed at the ends of the upper surfaces 22 on the protrusions 21 are rounded thereby.

The elastic abrasive employed in the second blasting may be an elastic abrasive in which abrasive grains are carried in and/or on an elastic body made from material having a low rebound elasticity, such as a rubber or elastomer. The abrasive grains may be carried on the elastic body by adhering the abrasive grains to the surface of the elastic body, or may be carried by kneading the abrasive grain into the elastic body.

The elastic abrasive having such a structure is suppressed by the elastic body from recoiling when the elastic abrasive is collided against the surface of the workpiece, and the elastic abrasive slides along the surface of the workpiece while being crushed by the impact and deforming the profile. The rough surface of the recess-protrusion surface formed during the first blasting is thereby polished so as to be made smooth.

The elastic abrasive employed is an elastic abrasive carrying abrasive grains of a size sufficiently small in relation to the width w of the recesses 24 formed by the first blasting. The size of the elastic abrasive is selectable according to the width w of the recesses 24 formed by the first blasting so as to lie in a range of from 50 µm to 2000 µm, and preferably in a range of from 100 µm to 1500 µm. The particle diameter of the elastic abrasive having good deformability may be a size larger than the width w of the recesses 24.

The abrasive grains to be carried in and/or on the elastic body have a higher hardness than the base material of the workpiece, and a size smaller than the width w of the recesses. The abrasive grains are, for example, selectable from abrasive grains of diamond, boron nitride, carborundum, green carborundum, alumina, white alumina, or boron carbide having an average particle diameter of from 0.1 µm to 100 µm.

The elastic abrasive may also be ejected in the second blasting, similarly to in the first blasting, using various known types of blasting apparatus, and an air type blasting apparatus is similarly preferably employed therefor.

When the second blasting is performed by an air type blasting apparatus, the ejection pressure is, for example, adjustable so as to lie in a range of from 0.05 MPa to 0.6 MPa.

The ejection angle of the abrasive with respect to the workpiece is adjustable according to the purpose for treatment and the profile of the workpiece so as to lie in a range from 10° to 90°.

The second blasting is configured so as to eject the elastic abrasive in at least four directions in plain view onto each portion on the surface of the workpiece rendered with the recess-protrusion surface by ejecting the elastic abrasive at a predetermined angle of inclination to the surface of the workpiece, and ejecting the elastic abrasive while moving the ejection nozzle and the workpiece relative to each other in a predetermined pattern.

More preferably, such relative movement is preferably performed plural times by changing ejection angles.

Adopting such a configuration enables polishing as far as corner portions of the bottom surfaces 25 of the recesses 24 formed on the surface of the workpiece to be performed with certainty, and thereby enables residual polish to be prevented from occurring.

Such relative movement can be performed by, for example, moving the ejection nozzle in a predetermined pattern using a multi-axis robot device.

The distance from the tip of the ejection nozzle to the surface of the workpiece (i.e., ejection distance) is adjustable according to the purpose for treatment and the shape of the workpiece, the abrasive being employed, the material of the workpiece, and other conditions so as to lie in a range from 3 mm to 300 mm.

The surface of the protrusions 21 and the recesses 24 formed on the surface of the workpiece are rendered by the second blasting as described above to an arithmetic average roughness Ra of not greater than 1.6 µm, and preferably not greater than 1.0 µm. In particular, when treating a dielectric layer of an electrostatic chuck, the upper surfaces 22 of the protrusions 21 that contact the substrate are polished to an arithmetic average roughness Ra of not greater than 0.2 µm, and edges e formed at the ends of the upper surfaces 22 of the protrusions 21 are rounded to a radius of not less than 10 µm.

By treating parts employed in equipment for fabrication of semiconductor by using the surface treatment method of the present invention, such as to form projections on the surface of a dielectric layer of an electrostatic chuck or the like, particles of contaminants are not liable to be generated, and chipping and cracking are not liable to occur.

When the workpiece is formed from a transparent material, the surface of a workpiece whose surface has become non-transparent, in the manner of frosted glass can be rendered transparent or nearly transparent.

EXAMPLES

Examples of treatment in which surfaces of hard-brittle materials are treated by the polishing method of the present invention will now be illustrated by way of Examples.

Example 1

(1) Outline of Treatment

The first blasting is performed on a silicon carbide (SiC) dielectric layer (200 mm in diameter, 5 mm in thickness) of an electrostatic chuck to form a uniform pattern of projections of truncated cone shape in which diameter φ1 of an apex portion is 450 µm, diameter φ2 of a bottom portion is 750 µm, and a height h is 180 µm so that a width w of valley bottoms at narrowest portions is 240 µm. The surface of the workpiece formed with such projections was then polished by the second blasting.

(2) Blasting Conditions

The first and second blasting conditions are listed in the following Table 1.

TABLE 1

Blasting Conditions for Example 1

| Treatment Condition | First blasting | Second blasting |
|---|---|---|
| Blasting Apparatus | Suction type robot device SCM-4RBT-401 manufactured by Fuji Manufacturing Co., Ltd. | Suction type robot device SFSR-4RBT-401 manufactured by Fuji Manufacturing Co., Ltd. |
| Abrasive | "FUJIRUNDUM GC" SiC #400 (silicon carbide) made by Fuji Manufacturing Co., Ltd. | "SIZ-D030-8" Dia#3000 (diamond) made by Fuji Manufacturing Co., Ltd. (particle diameter of 800 μm) |
| Ejection Pressure | 0.5 MPa | 0.3 MPa |
| Nozzle Diameter | φ8 mm | φ10 mm |
| Ejection Distance | 80 mm | 60 mm |
| Ejection Angle | 90° | 30° |
| Ejection Time | 4 hours | 6 hours |

(3) Treatment Results

Scanning electron microscope (SEM) images of the surface of the workpiece treated under the above blasting conditions are illustrated in FIG. 1, observation results for the protrusions through a laser microscope are illustrated in FIG. 2, and the observation results for the bottom surfaces of the recesses through a laser microscope are illustrated in FIG. 3.

Figure 1B:
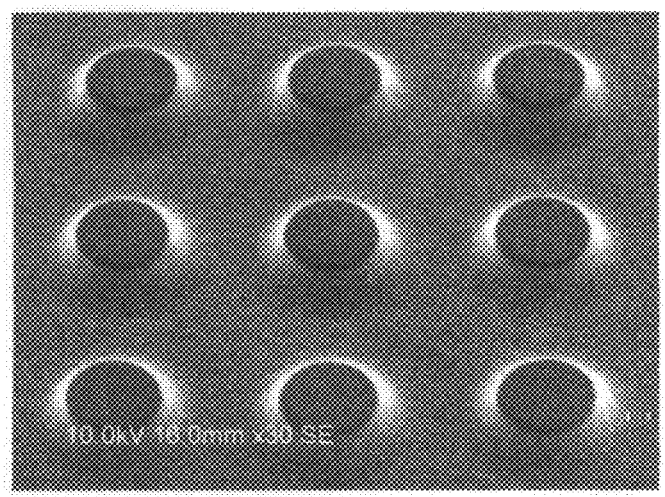

Confirmation can be made from the SEM images of FIG. 1 that, in comparison to the surface of the workpiece after the first blasting (see FIG. 1A), the surface of the workpiece after the second blasting (see FIG. 1B) is changed to a surface having a glossy finish in which the upper surfaces and the side surfaces of the protrusions, and the bottom surfaces of the recesses, are all smooth. Confirmation can also be made that edges formed at the ends of the upper surfaces of the protrusions, which have acute angles on the surface after the first blasting, are modified so as to achieve a rounded state.

Figure 2A:
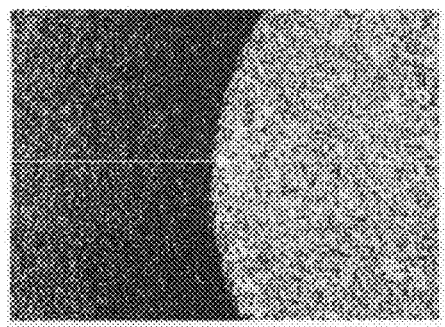
FIG. 2A illustrates a state after first blasting and FIG. 2B illustrates a state after second blasting.
Figure 2A:
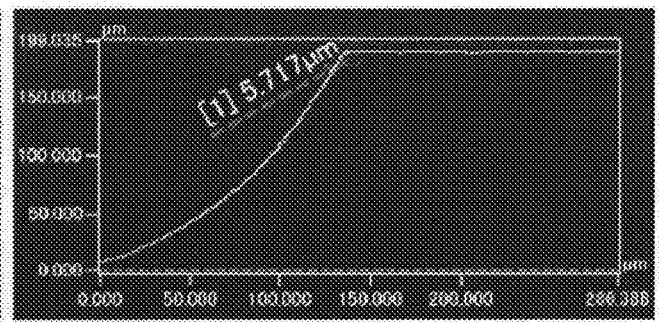
Figure 2B:
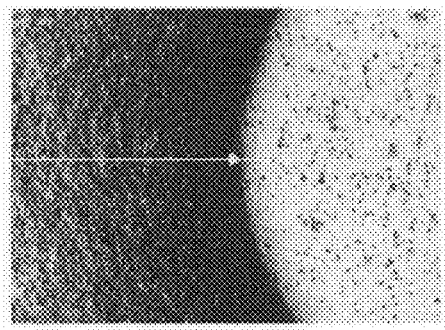
Figure 2B:
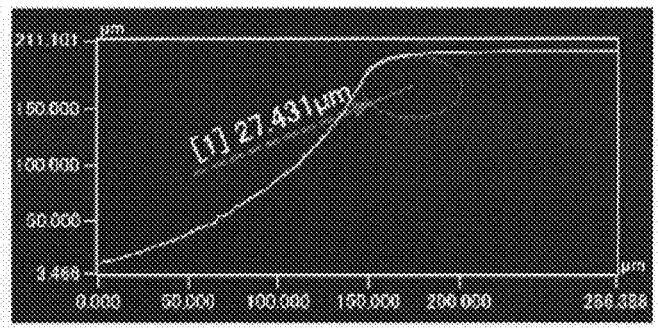
Figure 3A:
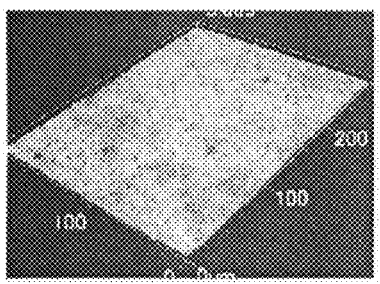
FIG. 3A illustrates a state after first blasting and FIG. 3B illustrates a state after second blasting.
Figure 3A:
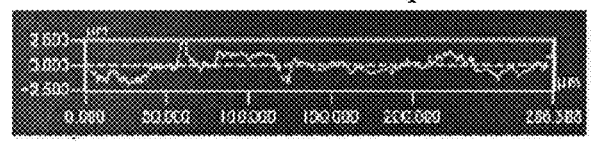
Figure 3A:
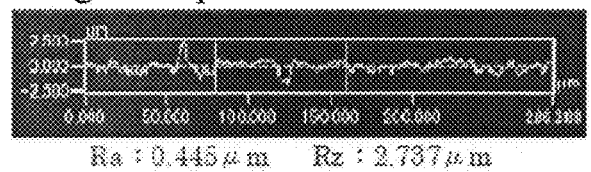
Figure 3B:
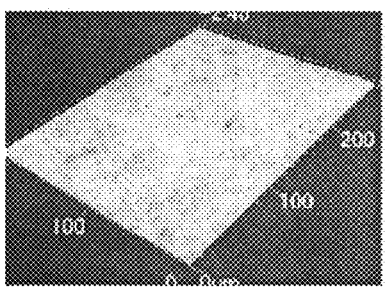
Figure 3B:
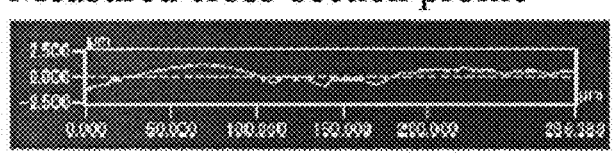
Figure 3B:
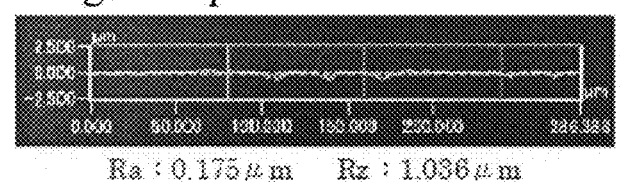

As the result of observations using a laser microscope, the edges arising at the ends of the upper surfaces of the protrusions are, as illustrated in FIG. 2A and FIG. 2B, observed to have a radius of 5.717 μm on the surface after the first blasting, but to be rounded to a radius of 27.431 μm on the surface after the second blasting, i.e. are polished to a state in which chipping and cracking etc. is not liable to occur.

Furthermore, for the surface of the recesses formed between the protrusions, as illustrated in FIG. 3, this surface has an arithmetic average roughness Ra of 0.445 μm and a maximum height Rz of 2.737 μm after the first blasting, however, after the second blasting, a smoothed state was achieved thereon in which roughness had been reduced by 60% or more to an arithmetic average roughness Ra of 0.175 μm and a maximum height Rz of 1.036 μm.

Moreover, as is apparent from the profile measurement data of FIG. 2, although the surface of the protrusions was smooth after the second blasting, there was hardly any change in height and overall shape compared to the protrusions after the first blasting. This confirmed that by performing the second blasting employing the elastic abrasive, uniform polishing could be achieved over the entire surface of the workpiece while maintaining the recess-protrusion profile imparted by the first blasting with hardly any change thereto.

In this manner, for the dielectric layer of an electrostatic chuck treated to form projections (pins) and protrusions 21 on the surface using the method of the present invention, not only were the upper surfaces of the protrusions that make contact with the substrate polished smooth, but also the entire surface was polished smooth, including the side surfaces of the protrusions and as far as the bottom surfaces of the recesses formed between the protrusions. This means that the surface is not liable to be the source of generation of contaminants such as particles even when the electrostatic chuck is employed to fix a substrate by being placed inside vacuum deposition film forming device.

Moreover, the entire surface was polished to a smooth surface from the upper surfaces and the side surfaces of the protrusions to the bottom surfaces of the recesses. Dirt such as oil or foreign matter etc. is accordingly not liable to adhere to the dielectric layer of the electrostatic chuck, and even were dirt to adhere, then simple removal is enabled.

Example 2

(1) Outline of Treatment

The first blasting is performed on a substrate made from alumina (40 mm×40 mm×1.5 mm) to form a predetermined pattern of protrusions having an embankment profile with a top side s1 of 135 μm, a bottom side s2 of 290 μm, a height h of 110 μm, so that a width w of bottom surfaces of recesses was 650 μm. The surface of the substrate formed with such protrusions was then polished by the second blasting.

(2) Blasting Conditions

The first and second blasting conditions are listed in the following Table 2.

TABLE 2

Blasting Conditions for Example 2

| Treatment Condition | First blasting | Second blasting |
|---|---|---|
| Blasting Apparatus | Suction type robot device SCM-4RBT-401 manufactured by Fuji Manufacturing Co., Ltd. | Suction type robot device SFSR-4RBT-401 manufactured by Fuji Manufacturing Co., Ltd. |
| Abrasive | #400 (aluminum oxide) "FUJIRUNDUM WA" made by Fuji Manufacturing Co., Ltd. | "SIZ-D030-8" Dia #3000 (diamond) made by Fuji Manufacturing Co., Ltd. (particle diameter of 800 μm) |

TABLE 2-continued

Blasting Conditions for Example 2

| Treatment Condition | First blasting | Second blasting |
|---|---|---|
| Ejection Pressure | 0.5 MPa | 0.3 MPa |
| Nozzle Diameter | φ8 mm | φ10 mm |
| Ejection Distance | 80 mm | 60 mm |
| Ejection Angle | 90° | 30° |
| Ejection Time | 15 minutes | 20 minutes |

(3) Treatment Results

Figure 4:
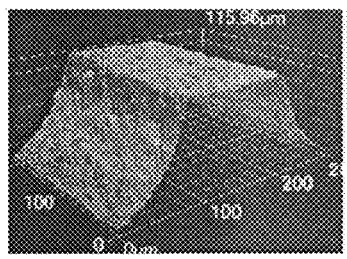
FIG. 4 illustrates a laser microscope image of a protrusion on the surface of a workpiece in Example 2 after first blasting, and measured cross-section profiles and roughness profiles of an upper surface and a side surface on the protrusion.
Figure 4:
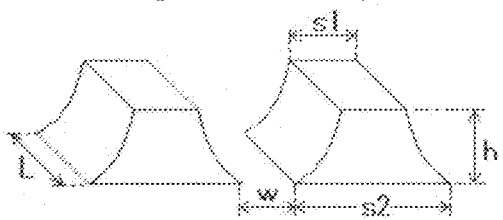
Figure 4:
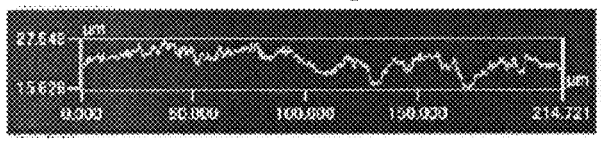
Figure 4:
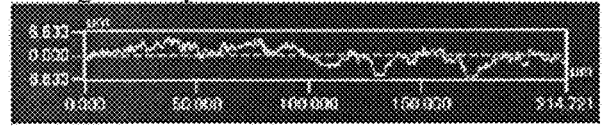
Figure 4:
Figure 4:
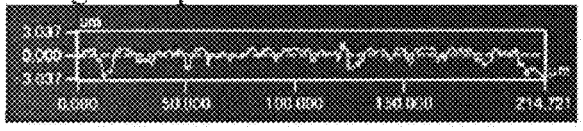
Figure 5:
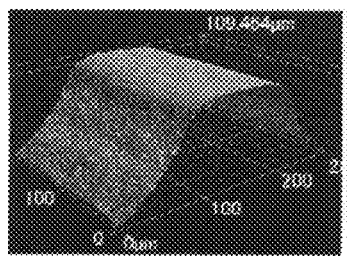
FIG. 5 illustrates a laser microscope image of the protrusion on the surface of a workpiece in Example 2 after second blasting, and measured cross-section profiles and roughness profiles of the upper surface and the side surface on the protrusion.
Figure 5:
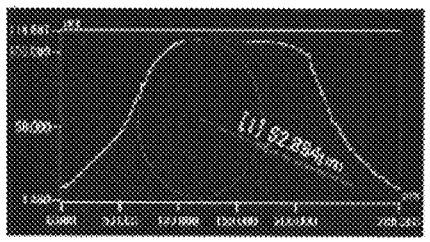
Figure 5:
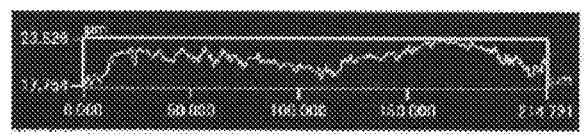
Figure 5:
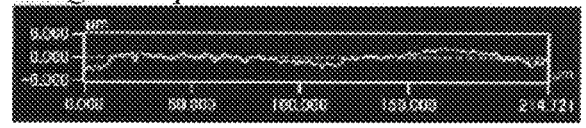
Figure 5:
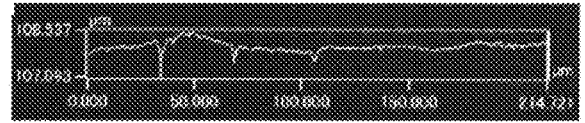
Figure 5:
Figure 6:
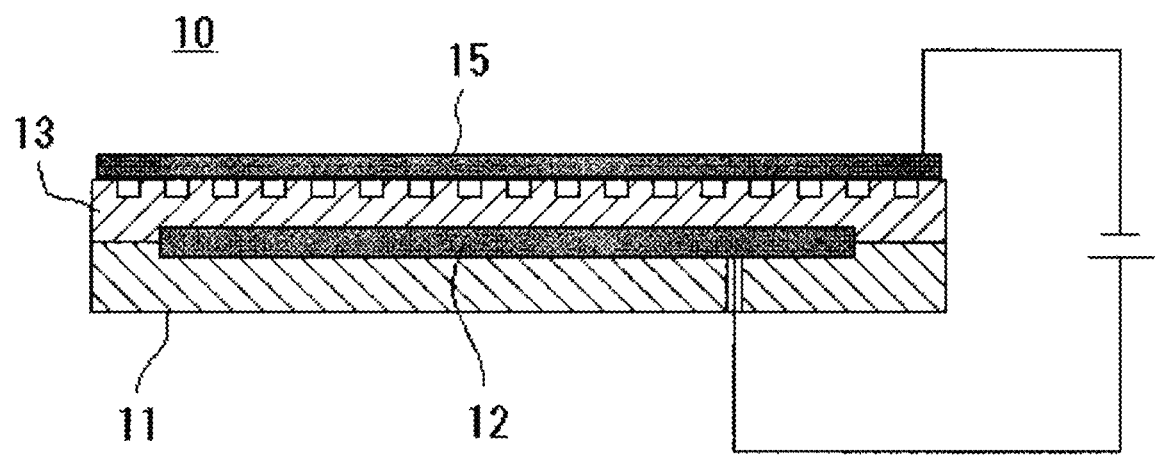
FIG. 6 is a schematic explanatory diagram of an electrostatic chuck.
Figure 7:
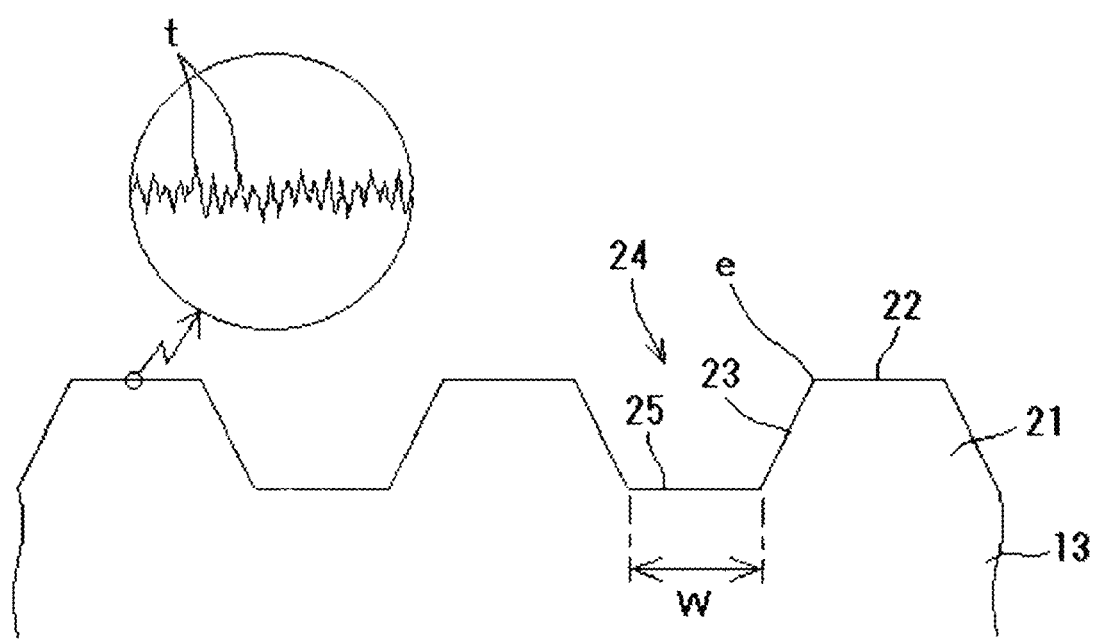
FIG. 7 is an explanatory diagram of a surface formed with projections on a dielectric layer of an electrostatic chuck.
Figure 8:
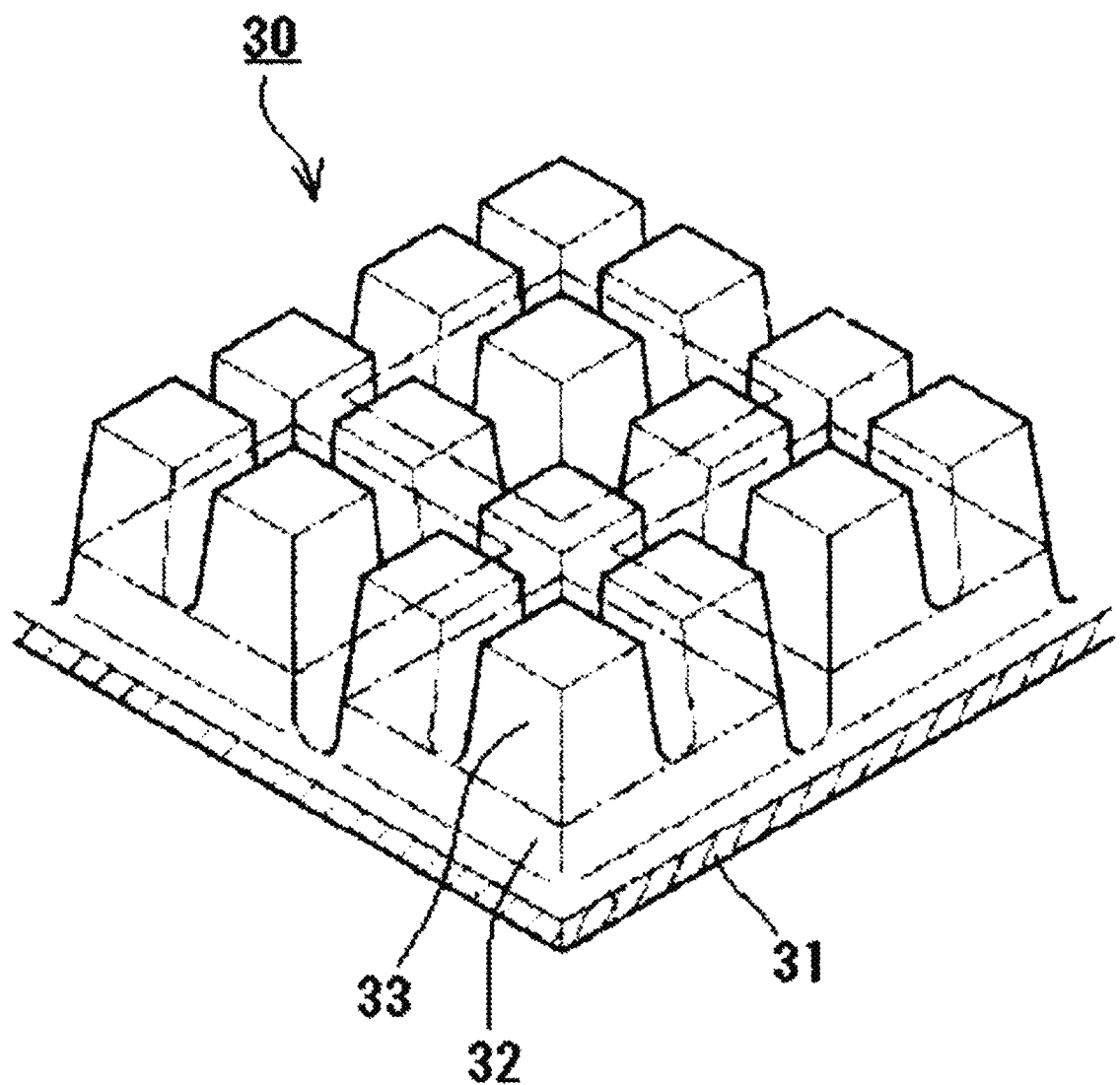
FIG. 8 is an explanatory diagram of a polishing pad (Patent Document 4).

The results of measuring the surface roughness of upper surfaces and side surfaces of the protrusions formed on the surface of the substrate before and after the second blasting, and measuring rounding of edges formed at the ends of the upper surfaces of the protrusions, are illustrated in FIG. 4 and FIG. 5.

As illustrated in FIG. 4, although the surface roughness of the side surfaces and upper surfaces of the protrusions after the first blasting and before the second blasting are, respectively, an arithmetic average roughness Ra of 1.856 μm and of 0.681 μm, and these had been reduced to 0.973 μm and 0.106 μm respectively after the second blasting, as illustrated in FIG. 5, thus a significant improvement in surface roughness was confirmed.

Moreover, regarding the edges at the ends of the upper surfaces of the protrusions, in contrast to the edges after the first blasting which had a radius of 4.150 μm, the edges after the second blasting had a radius of 52.884 μm, therefore, rounding of the edges thereby were confirmed.

Thus the broadest claims that follow are not directed to a machine that is configure in a specific way. Instead, said broadest claims are intended to protect the heart or essence of this breakthrough invention. This invention is clearly new and useful. Moreover, it was not obvious to those of ordinary skill in the art at the time it was made, in view of the related art when considered as a whole.

Moreover, in view of the revolutionary nature of this invention, it is clearly a pioneering invention. As such, the claims that follow are entitled to very broad interpretation so as to protect the heart of this invention, as a matter of law.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described;

DESCRIPTIONS OF REFERENCE NUMERALS

10. Electrostatic chuck
11. Ceramic plate
12. Metal electrode layer
13. Dielectric layer
15. Substrate
21. Protrusion
22. Upper surface (of the protrusion)
23. Side surface (of the protrusion)
24. Recess
25. Bottom surface (of the recess)
30. Polishing pad
31. Base layer
32. Pedestal
33. Tip portion
t. Peak portion
e. Edge

The invention claimed is:

1. A method for surface treatment of a workpiece made from a hard-brittle material, comprising:

performing first blasting employing abrasive grains of higher hardness than a hardness of a base material of the workpiece for forming a three dimensional recess-protrusion profile on a surface of the workpiece, the three dimensional recess-protrusion profile having a multitude of protrusions and a multitude of recesses formed between the protrusions with a width of at least 50 μm at narrowest portions between the protrusions; and performing second blasting by ejecting an elastic abrasive having a structure in which abrasive grains having a smaller particle diameter than the width of the recesses are carried on and/or in an elastic body of low rebound elasticity to the surface of the workpiece formed with the recess-protrusion profile so that the elastic abrasive slides along the surface of the workpiece by the impact and deforming the profile for polishing the surface of the workpiece so as to achieve an arithmetic average roughness Ra of not greater than 1.6 μm on the surface of the protrusions and the recesses on the workpiece while still maintaining the recess-protrusion profile formed by the first blasting.

2. The method according to claim 1, wherein:

the protrusions with flat upper surfaces are formed by the first blasting; and edges formed at ends of the upper surfaces of the protrusions are rounded to a radius of not less than 10 μm by the second blasting.

3. The method according to claim 2, wherein the surface of the workpiece made from the hard-brittle material is a substrate suction surface of a substrate fixing tool provided in equipment for fabrication of semiconductor.

4. The method according to claim 2, wherein the second blasting includes ejection of the elastic abrasives against the surface of the workpiece from at least four directions in plain view.

5. The method according to claim 4, wherein the elastic abrasive employed in the second blasting includes abrasive grains carried on and/or in an elastic body of rubber or elastomer having a low rebound elasticity, and the abrasive grains are selected from out of the group comprising diamond, boron nitride, carborundum, green carborundum, alumina, white alumina, and boron carbide abrasive grains having an average particle diameter that is smaller than the width of the recesses and lies in a range from 0.1 µm to 100 µm.

6. The method according to claim 2, wherein the elastic abrasive employed in the second blasting includes abrasive grains carried on and/or in an elastic body of rubber or elastomer having a low rebound elasticity, and the abrasive grains are selected from out of the group comprising diamond, boron nitride, carborundum, green carborundum, alumina, white alumina, and boron carbide abrasive grains having an average particle diameter that is smaller than the width of the recesses and lies in a range from 0.1 µm to 100 µm.

7. The method according to claim 3, wherein the elastic abrasive employed in the second blasting includes abrasive grains carried on and/or in an elastic body of rubber or elastomer having a low rebound elasticity, and the abrasive grains are selected from out of the group comprising diamond, boron nitride, carborundum, green carborundum, alumina, white alumina, and boron carbide abrasive grains having an average particle diameter that is smaller than the width of the recesses and lies in a range from 0.1 µm to 100 µm.

8. The method according to claim 3, wherein upper surfaces of protrusions on the substrate suction surface of the substrate fixing tool provided in the equipment for fabrication of semiconductor are polished by the second blasting to an arithmetic average roughness Ra of not greater than 0.2 µm.

9. The method according to claim 1, wherein the surface of the workpiece made from the hard-brittle material is a substrate suction surface of a substrate fixing tool provided in equipment for fabrication of semiconductor.

10. The method according to claim 9, wherein upper surfaces of protrusions on the substrate suction surface of the substrate fixing tool provided in the equipment for fabrication of semiconductor are polished by the second blasting to an arithmetic average roughness Ra of not greater than 0.2 µm.

11. The method according to claim 9, wherein the elastic abrasive employed in the second blasting includes abrasive grains carried on and/or in an elastic body of rubber or elastomer having a low rebound elasticity, and the abrasive grains are selected from out of the group comprising diamond, boron nitride, carborundum, green carborundum, alumina, white alumina, and boron carbide abrasive grains having an average particle diameter that is smaller than the width of the recesses and lies in a range from 0.1 µm to 100 µm.

12. The method according to claim 1, wherein the second blasting includes ejection of the elastic abrasives against the surface of the workpiece from at least four directions in plain view.

13. The method according to claim 12, wherein the elastic abrasive employed in the second blasting includes abrasive grains carried on and/or in an elastic body of rubber or elastomer having a low rebound elasticity, and the abrasive grains are selected from out of the group comprising diamond, boron nitride, carborundum, green carborundum, alumina, white alumina, and boron carbide abrasive grains having an average particle diameter that is smaller than the width of the recesses and lies in a range from 0.1 µm to 100 µm.

14. The method according to claim 1, wherein the elastic abrasive employed in the second blasting includes abrasive grains carried on and/or in an elastic body of rubber or elastomer having a low rebound elasticity, and the abrasive grains are selected from out of the group comprising diamond, boron nitride, carborundum, green carborundum, alumina, white alumina, and boron carbide abrasive grains having an average particle diameter that is smaller than the width of the recesses and lies in a range from 0.1 µm to 100 µm.

* * * * *